United States Patent
Poplevine et al.

(10) Patent No.: US 7,167,392 B1
(45) Date of Patent: Jan. 23, 2007

(54) NON-VOLATILE MEMORY CELL WITH IMPROVED PROGRAMMING TECHNIQUE

(75) Inventors: Pavel Poplevine, Foster City, CA (US); Annie-Li-Keow Lum, Milpitas, CA (US); Hengyang Lin, San Jose, CA (US); Andrew J. Franklin, Santa Clara, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 11/183,198

(22) Filed: Jul. 15, 2005

(51) Int. Cl.
*G11C 11/34* (2006.01)
*G11C 14/00* (2006.01)
*G11C 16/04* (2006.01)

(52) U.S. Cl. ............ 365/185.08; 365/154; 365/185.19

(58) Field of Classification Search ................ 365/185, 365/185.08
See application file for complete search history.

(56) References Cited

U.S. PATENT DOCUMENTS

| 6,137,723 | A | 10/2000 | Bergemont et al. | 365/185.18 |
| 6,985,386 | B1 * | 1/2006 | Mirgorodski et al. | 365/185.05 |
| 6,992,927 | B1 * | 1/2006 | Poplevine et al. | 365/185.05 |
| 7,020,027 | B1 * | 3/2006 | Poplevine et al. | 365/185.28 |
| 7,042,763 | B1 * | 5/2006 | Mirgorodski et al. | 365/185.05 |

* cited by examiner

*Primary Examiner*—Amir Zarabian
*Assistant Examiner*—Michael Weinberg
(74) *Attorney, Agent, or Firm*—Stallman & Pollock LLP

(57) ABSTRACT

A non-volatile memory (NVM) cell splits its basic function, i.e. program, erase, read and control, among a four PMOS transistor structure, allowing independent optimization of each function. The cell structure also includes an embedded static random access memory (SRAM) cell that utilizes a latch structure to preprogram data to be written to the cell. The programming method for the cell utilizes a reverse Fowler-Nordheim tunneling mechanism with a very small programming current, allowing an entire NVM array to be programmed at one cycle.

6 Claims, 6 Drawing Sheets

NON-VOLATILE MEMORY CELL WITH IMPROVED PROGRAMMING TECHNIQUE

TECHNICAL FIELD

The present invention relates to integrated circuit memory devices and, in particular, to a 4-transistor PMOS non-volatile memory (NVM) cell that includes an embedded static random access memory (SRAM) cell. The NVM cell utilizes a reverse Fowler-Nordheim tunneling programming technique with very low programming current that allows an entire NVM cell array to be programmed in one cycle.

BACKGROUND OF THE INVENTION

Figure 1:
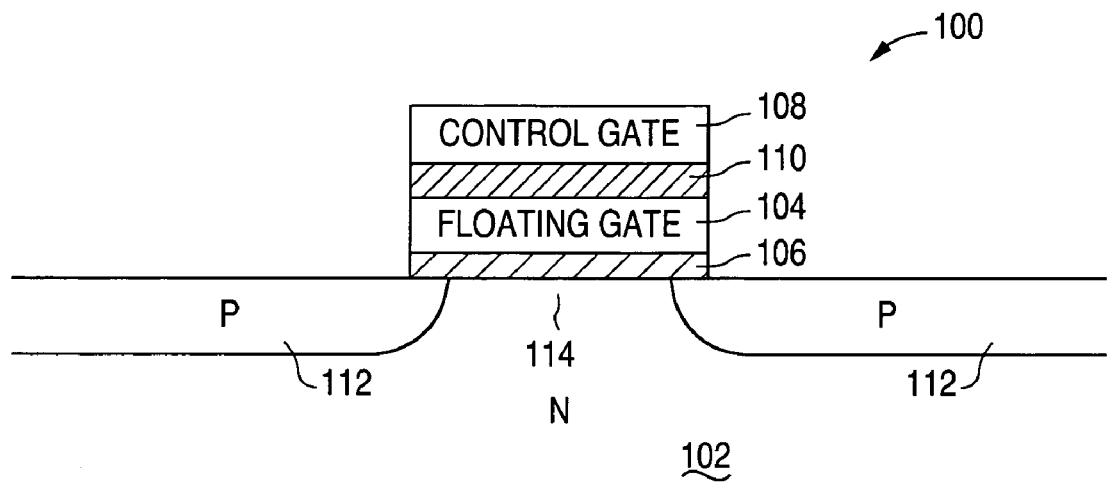
FIG. 1 is a partial cross section drawing illustrating a conventional P-channel insulated gate field effect transistor (P-IGFET) stacked gate non-volatile memory (NVM) cell.

FIG. 1 shows a conventional P-channel insulated gate field effect transistor (P-IGFET), e.g., a P-channel metal oxide semiconductor field effect transistor (P-MOSFET), stacked gate NVM cell 100 formed in an N-type region 102 of semiconductor material (e.g., a crystalline silicon substrate). The N-type region 102 is typically an N-well formed in a P-type silicon substrate. The NVM cell 100 typically includes a polysilicon floating gate 104 that is separated from the N-type region 102 by a layer of thin "gate" silicon dioxide 106. A polysilicon control gate 108 is separated from the floating gate 104 by a layer of dielectric material 110, typically a sandwich of oxide-nitride-oxide (ONO). Two P-type diffusion regions 112 are formed in the N-type region 102 at the sides of the stacked gate structure to provide the source and drain regions of the NVM cell 100, defining an N-type channel region 114 between them. Integrated circuit fabrication techniques for making the NVM cell 100 are well known in the industry.

As is also well known, the conventional programming method for the NVM cell 100 uses hot electron injection. When applied to a stacked gate NVM cell 100, the hot electron injection programming method assumes that a high negative voltage is applied to the drain region of the cell 100. Depending upon the erasing and coupling coefficient(s), a corresponding voltage is applied to the control gate 108, thereby bringing the potential of the floating gate 104 to a value that is negative, but lower in absolute value as compared with the drain potential. Under these bias conditions, a high lateral electrical field is generated, thereby creating hot electrons that are affected by a high perpendicular electrical field such that the hot electrons tunnel through the thin gate oxide 106 to reach the floating gate 104. The amount of injection current depends primarily upon the potentials of the drain region and floating gate electrode 104 such that, with more drain voltage, more injection takes place. Further discussion of the NVM cell 100 and its programming technique will be found in U.S. Pat. No. 6,137,723, issued Oct. 24, 2000, which is incorporated herein by reference in its entirety to provide background information regarding the present invention.

Figure 2:
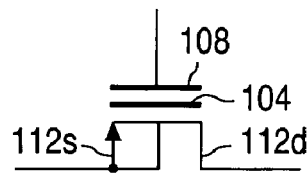
FIG. 2 is a schematic diagram of the FIG. 1 NVM cell.

FIG. 2 shows the NVM memory cell 100 of FIG. 1 in electrical schematic form, including a body-connected N-type source region 112s and an N-type drain region 112d.

Figure 3:
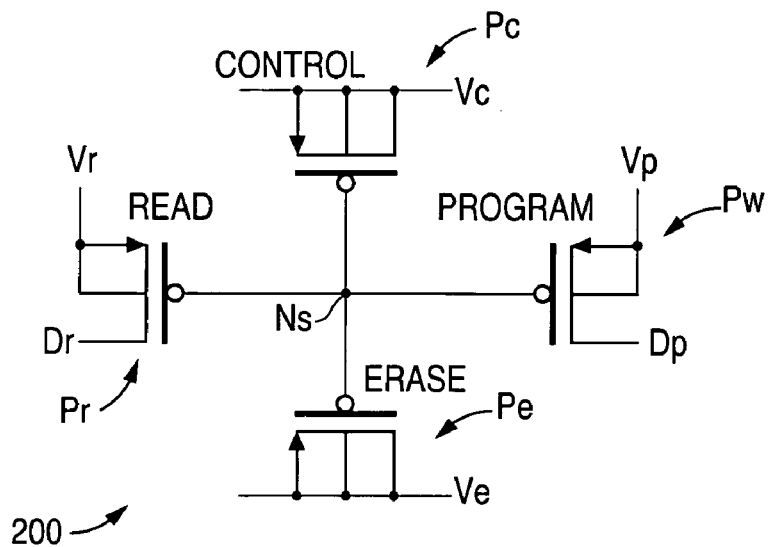
FIG. 3 is a schematic diagram illustrating a 4-transistor PMOS NVM cell.

Referring to FIG. 3, co-pending and commonly-assigned U.S. patent application Ser. No. 10/895,710, titled "Improved Nonvolatile Memory Cell", filed by Poplevine et al. on Jul. 8, 2004 (now U.S. Pat. No. 6,992,927), discloses an NVM memory cell 200 that includes four P-IGFETs connected to a common storage node Ns, with one P-IGFET transistor for each of the four primary cell functions: program (or write), read, erase and control. U.S. Pat. No. 6,992,927 is hereby incorporated by reference in its entirety.) The NVM cell 200, while being somewhat larger in size or circuit area than the conventional stacked gate cell 100 described above, allows for independent and improved optimization of each cell function.

The programming function of the 4-transistor NVM cell 200 is controlled by a first PMOS programming transistor Pw with interconnected source and bulk regions to which a programming voltage Vp is applied. A programming signal Dp is applied to the drain of transistor Pw. The gate electrode of programming transistor Pw is connected to the common storage node Ns.

The read function of the NVM cell 200 is controlled by a second PMOS read transistor Pr having interconnected source and bulk regions to which a read voltage Vr is applied, a drain region from which a read signal Dr is received, and a gate electrode connected to the common storage node Ns.

The erase function of the NVM cell 200 is controlled by a third PMOS erase transistor Pe having interconnected drain, source and bulk regions to which an erase voltage Ve is applied, and a gate electrode connected to the common storage node Ns.

The control function of the NVM cell 200 is controlled by a fourth PMOS control transistor Pc having interconnected drain, source and bulk regions to which a control voltage Ve is applied, and a gate electrode connected to the common storage node Ns.

The NVM cell 200 can be programmed in any of a number of ways, including conventional techniques as follows. During programming, or writing, the programming voltage Vp (e.g., approximately 5 volts) is applied to programming transistor Pw as described above, with all other electrodes being connected to the circuit reference potential (e.g., ground). During erasing, an erase voltage Ve (e.g., approximately 10 volts) is applied to the erase transistor Pe, with all other electrodes connected to the circuit reference potential. During reading, a read voltage Vr (e.g., approximately 1 volt) is applied to read transistor Pr, and all other electrodes are connected to the circuit reference potential. (Such voltages are typical for oxide thicknesses in the range of 60–80 Angstroms.)

Figure 4:
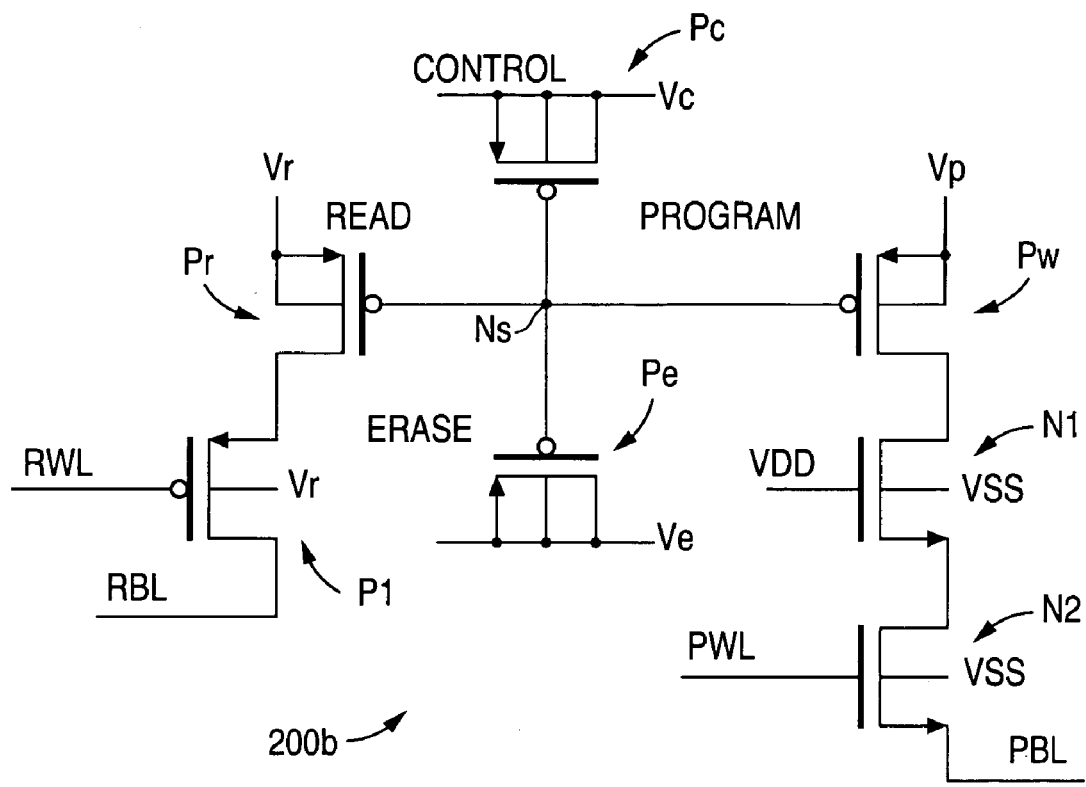
FIG. 4 is a schematic diagram illustrating the FIG. 3 NVM cell adapted for incorporation into an NVM cell array.

FIG. 4 shows the 4-transistor NVM cell 200 of FIG. 3 adapted to include additional PMOS transistor P1 and NMOS transistors N1, N2 for facilitating the use of the NVM cell 200 within an NVM cell array. For example, to read data from the common storage node Ns, P-channel pass transistor P1 is used. To program data to the common storage node Ns, a cascade circuit that includes the two N-channel pass transistors N1, N2 is used to prevent a high voltage from appearing between a gate electrode and a drain or source region.

Figure 5:
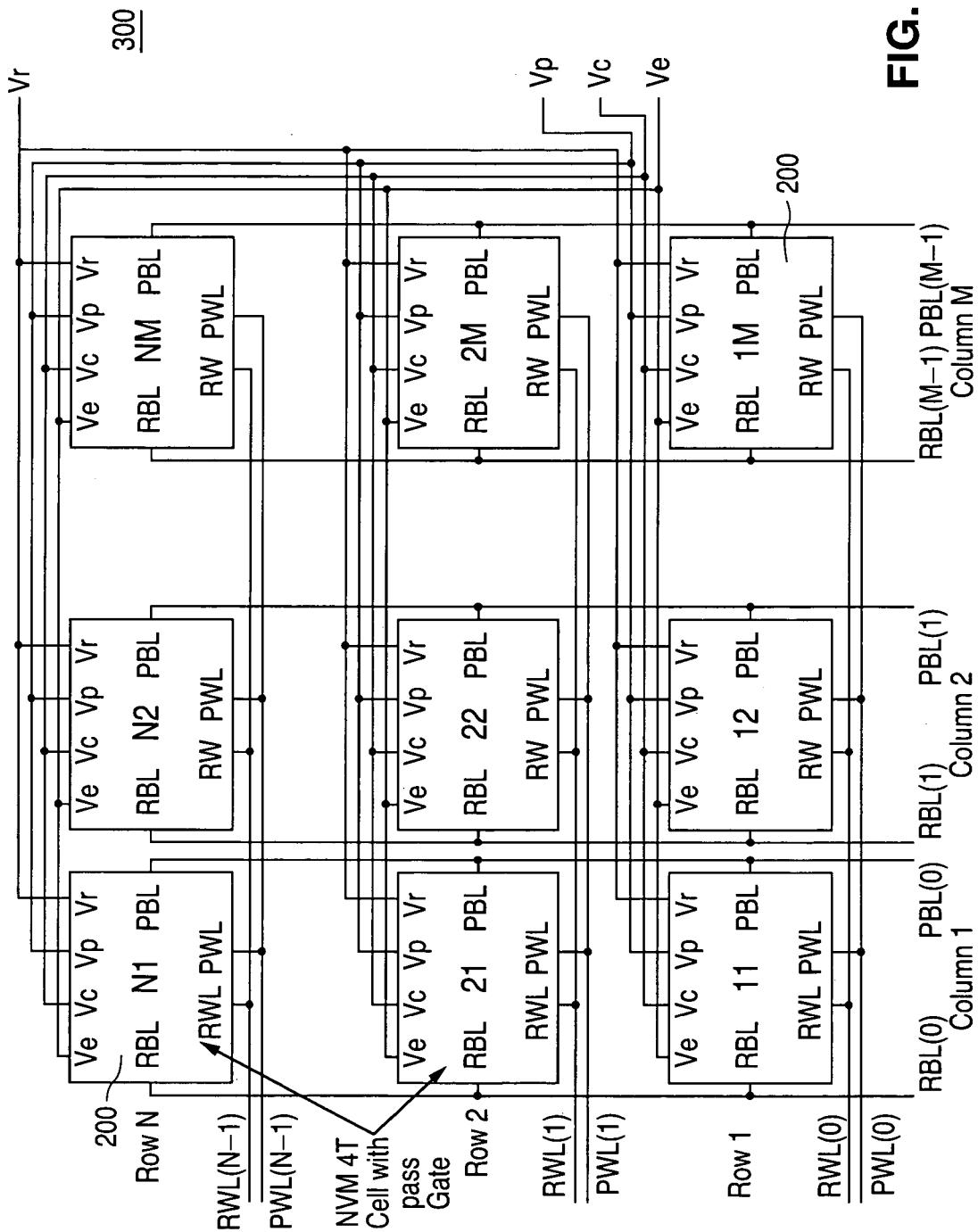
FIG. 5 is a block diagram illustrating an NVM cell array that includes a plurality of adapted NVM cells of the type shown in FIG. 4.

FIG. 5 shows a plurality of NVM memory cells 200, adapted as shown in FIG. 4, incorporated into an NVM cell array 300. The NVM cell array 300 includes M columns of adapted cells 200 and N rows of adapted cells 200. The program word line PWL is utilized to select the rows of the array 300 to be programmed, while the read word line RWL is utilized to select the rows of the array to be read. The erase voltage Ve, the program voltage Vp, the control voltage Vc and the read voltage Vr are applied to each cell directly. With no high voltage switches or other supporting circuitry, significantly simplified connections can be made from the array 300 to external or internal voltage and signal sources and to the signal destinations.

The operational modes of erase, program and read for the array 300 are similar to those described above for a single NVM cell 200. During the erase mode, the program word lines PWL(0)–PWL(N-1) are at a logic low, the read word lines RWL(0)–RWL(N-1) are at a logic high, the erase voltage Ve is applied, and the rest of the signal lines are at circuit reference potential. This causes all cells in the array 300 to be erased.

During the programming mode, the read word lines RWL(0)–RWL(N-1) are at a logic high, one of the program word lines, e.g., PWL(0), is at a logic high while the remaining program word lines, e.g., PWL(1)–PWL(N-1), are at a logic low. To program a particular cell 200 in the array 300, the corresponding program bit line, e.g., PBL(0), is at a logic low. To erase the remaining cells in the array 300, the corresponding program bit lines, e.g., PBL(1)–PBL(M-1), are left floating. The program voltage Vp is applied to all cells in the array 300, while the remaining electrodes are at circuit reference potential.

During the read mode, the program word lines PWL(0)–PWL(N-1) are at a logic low, one of the read word lines, e.g., RWL(0), is at a logic low, while the remaining read word lines, e.g., RWL(1)–RWL(N-1) are at a logic high. On each of the read bit lines RBL(0)–RBL(M-1), a high current or voltage is received for each corresponding cell in the array 300 that had been programmed, while a low current or voltage is received for each corresponding cell that had been erased. The read voltage Vr is applied to all cells in the array 300, while the remaining electrodes are at circuit reference potential.

Different mechanisms and different program modes for the NVM cell 200 and for the array 300 are described in the following three co-pending and commonly-assigned U.S. patent applications: application Ser. No. 10/895,711, titled "Programming Method for Nonvolatile Memory Cell", filed by Poplevine et al. on Jul. 8, 2004 (now U.S. Pat. No. 7,042,763); application Ser. No. 10/895,713, titled "Programming Method for Nonvolatile Memory Cell", filed by Poplevine et al. on Jul. 8, 2004 (now U.S. Pat. No. 6,985,386); and application Ser. No. 10/895,712, titled "Programming method for Nonvolatile Memory Cell", filed by Poplevine et al. on Jul. 8, 2004 (now U.S. Pat. No. 7,020,027). (Each of these three patents is hereby incorporated by reference in its entirety.)

Co-pending and commonly-assigned U.S. patent application Ser. No. 11/182,115 titled "Reverse Fowler-Nordheim Tunneling Programming For Non-Volatile Memory Cell", filed by Poplevine et al. on the same date as this patent application, discloses an alternate method for programming the FIG. 4 NVM cell. application Ser. No. 11/182,115 is hereby incorporated by reference in its entirety.

More specifically, application Ser. No. 11/182,115 discloses a programming method that utilizes reverse Fowler-Nordheim (FN) tunneling to program the above-described 4-transistor NVM cell 200. When the potential difference between floating gate and drain and source and body exceeds the tunneling threshold voltage ($V_{FN}$), electrons tunnel from drain and source to the gate. This makes the floating gate negatively charged.

Figure 6:
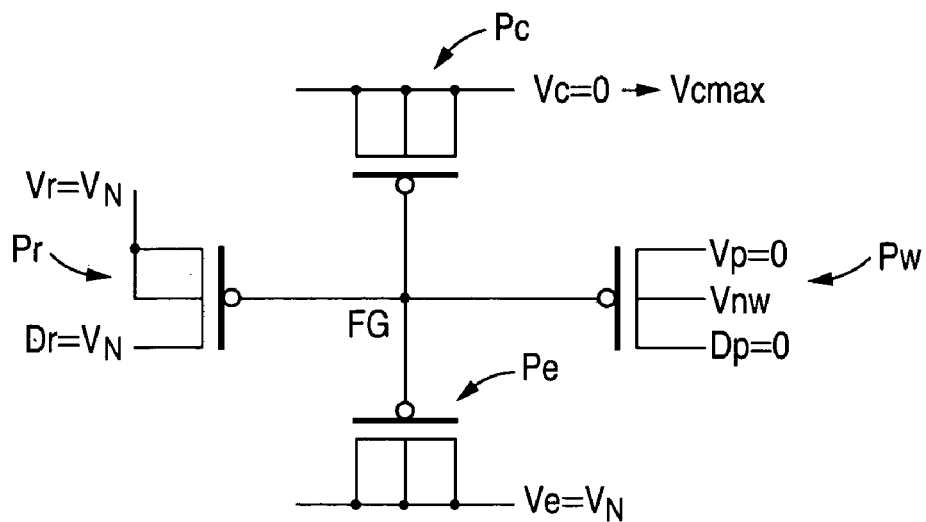
FIG. 6 is a schematic diagram illustrating the bias conditions for programming the FIG. 4 NVM cell.

The programming conditions for the NVM cell 200 in accordance with the disclosure of application Ser. No. 11/182,115 are shown in FIG. 6. The read voltage Vr, the read signal Dr and the erase voltage Ve are connected to an inhibiting voltage $V_N$. Inhibiting voltage $V_N$ should be at a level high enough that prevents reverse Fowler-Nordheim tunneling, but low enough to ensure no forward tunneling. The inhibiting voltage $V_N$ depends on gate oxide thickness; for example, $V_N \sim 3.3V$ for a gate oxide thickness of 70 Å. Setting the read voltage Vr, the read signal Dr and the erase voltage Ve to $V_N$ is done to prevent the read transistor Pr and the erase transistor Pe from being programmed. The programming voltage Vp and programming signal Dp of the program transistor Pw are both tied to 0V. The voltage Vnw can be tied to either 0v or to Vdd. The control gate voltage Vc is then swept from 0V to a predefined maximum voltage Vcmax in a preselected programming time Tprog. The programming time Tprog is in the range of tens of milliseconds. The programming time Tprog affects the amount of negative charge that will tunnel to the floating gate (FG in FIG. 6).

The maximum voltage Vcmax must exceed the tunneling threshold voltage $V_{FN}$; it affects the amount of negative charge to put on the floating gate. The voltage applied to Vc is coupled through control transistor Pc to the floating gate FG. When voltage at the floating gate FG reaches the tunneling threshold voltage $V_{FN}$, then electrons tunnel from the drain/source/body of the program transistor Pw to the floating gate FG, making the floating gate FG more negative. The tunneling process continues as control gate voltage Vc is swept. At the end of the program cycle, the control gate voltage Vc is ramped back down to 0v. As a result of this process, the floating gate FG is left with a net negative charge from the reversed Fowler-Nordheim tunneling program.

There is no current consumption in the read transistor Pr, the erase transistor Pe or the control transistor Pc during the programming process. The only current is the Fowler-Nordheim tunneling current, which is about 10 pA per transistor. Those skilled in the art will appreciate that this allows the use of a smaller charge pump.

NVM cells not selected to be programmed are inhibited from being program. This is done by applying the inhibiting voltage $V_N$ to all of the electrodes (Vr, Dr, Ve, Dp, Vp and Vnw) of the unselected cells.

DESCRIPTION OF THE INVENTION

For each of the NVM cell arrays disclosed in the above-cited related Poplevine et al applications, to program the array, it is necessary to cycle through all the rows and columns of the array, causing the program time for the array to be long. In accordance with the present invention, a conventional 6-transistor static random access memory (SRAM) cell is embedded within the FIG. 4 4-transistor NVM cell to enable mass programming of the NVM cell array. This reduces the total program time for the array.

Figure 7:
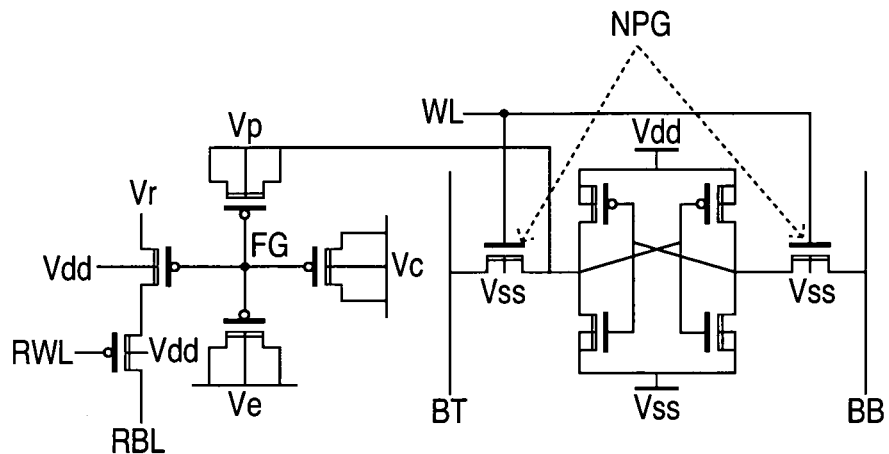
FIG. 7 is a schematic diagram illustrating a 4-transistor PMOS NVM cell with an embedded 6-transistor static random access memory (SRAM) cell in accordance with the concepts of the present invention.

Referring to FIG. 7, an NVM cell in accordance with the present invention includes the 4-transistor NVM cell described above with the addition of an embedded 6-transistor SRAM (Static Random Access memory). As shown in FIG. 7, the SRAM cell includes two NMOS pass gates (NPG) and a conventional 4-transistor cross-coupled latch (two PMOS devices and two NMOS devices) to maintain written data. To access the SRAM cell, word line WL is at the VDD power level to open the two NMOS pass gates NPG. To write a zero into the latch, bit line BT is at zero and bit line BB is at the VDD power level. To write a one into the latch, bit line BB is at zero and bit line BT is at the VDD power level. To read from the SRAM cell, both bit line BT and bit line BB are precharged to VDD. A zero is read if bit line BT is discharged to ground and a one is read if bit line BB if discharge to ground.

Prior to the programming cycle, data are prewritten to the SRAM cells in the entire array. After that, the programming cycle can be started. To program the array, the reverse Fowler-Nordhiem programming sequence disclosed in above-references application Ser. No. 11/182,115 is used. As discussed above, this method consumes less current, which is ideal for mass programming. More specifically, and with continuing reference to FIG. 7, nodes Vr, Dr and Ve of the 4-transistor PMOS cell are connected to $V_N$ to prevent the read transistor Pr and the erase transistor Pe from being programmed. The source region and the drain region of the programming transistor Pw are shorted together; the source and drain region potential is provided by the programming voltage Vp in the SRAM cell, as shown in FIG. 7. To program a cell, a data zero/ground must be written into the Vp node of the SRAM cell. This will make drain and source of the program transistor Pw at ground during the programming cycle. To shield a 4T NVM cell from being programmed, a data one/Vdd is written to the Vp node instead. The control gate voltage Vc is globally connected. The control gate voltage Vc is then swept from 0v to Vcmax in programming time Tprog, as discussed above. The programming time Tprog is around the range of milliseconds. The programming time Tprog affects the amount of negative charge that will tunnel to the floating gate (FG in FIG. 7).

As discussed above, the maximum programming voltage Vcmax must exceed the tunneling threshold voltage $V_{FN}$; it affects the amount of negative charge to put on the floating gate. Voltage applied to Vc is coupled through control transistor Pc to the floating gate (FG). When voltage at the floating gate FG reaches the tunneling threshold $V_{FN}$, electron tunnels from the drain/source/body (or drain and source only for the FIG. 7A embodiment, in which the body connects to VDD) of the program transistors Pw to the floating gate FG. This will make the floating gate FG more negative. At the end of the programming cycle, the control gate voltage Vc is ramped back down to 0v. The floating gate FG is left with a net negative charged from the reverse Fowler-Nordheim tunneling program.

Figure 7A:
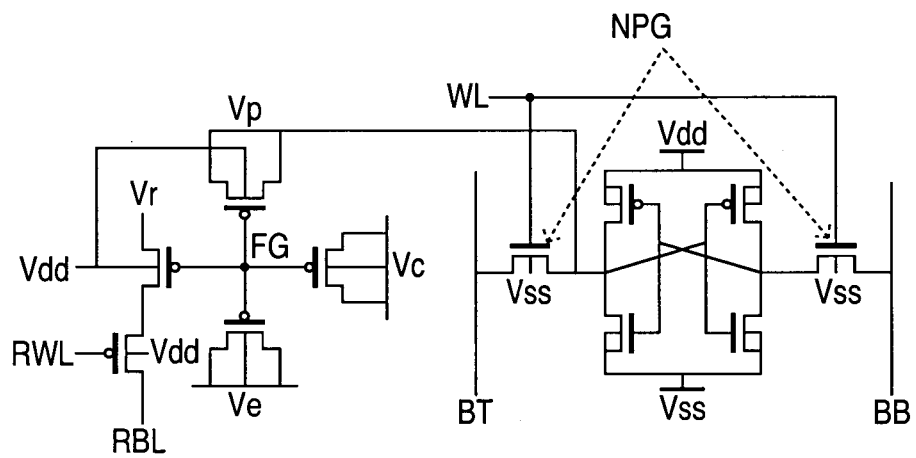
FIG. 7A is a schematic diagram illustrating a 4-transistor PMOS NVM cell with an embedded 6-transistor static random access memory (SRAM) cell in accordance with the concepts of the present invention, with the body of each device in the 4-transistor cell connected to VDD.
Figure 8:
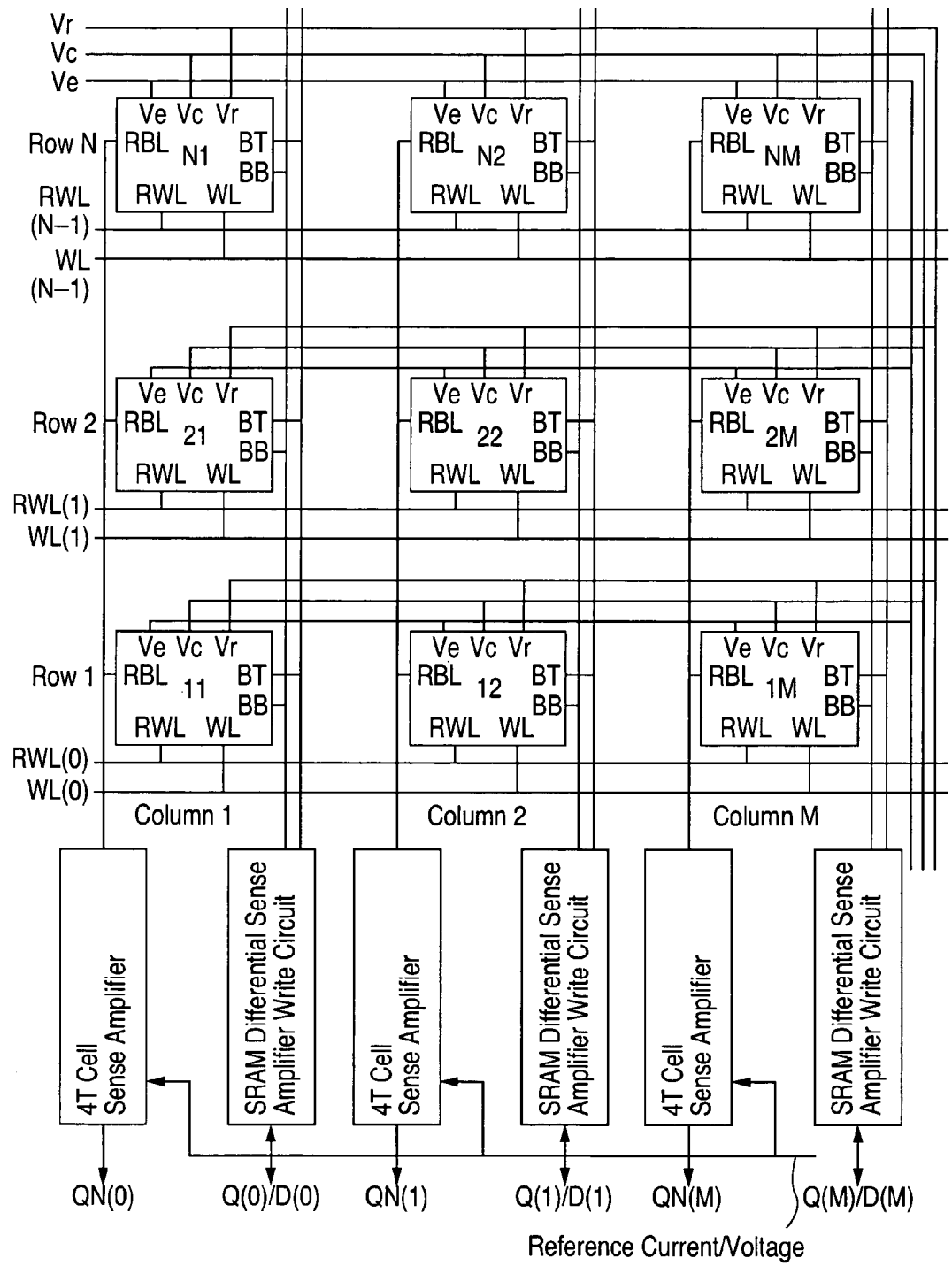
FIG. 8 is a block diagram illustrating an NVM cell array that includes a plurality of cells of the type shown in FIG. 7 and FIG. 7A.

FIG. 8 shows the implementation of an NVM cell array using the cell shown in FIG. 7 and FIG. 7A. The array has N rows and M columns. The Word Line (WL) selects a row to be written or to be read from the SRAM cell. The Read Word Line (RWL) selects a row to be read from the 4T NVM cell. The erase voltage (Ve), the control voltage (Vc) and the read voltage (Vr) are applied to all cells directly without any high voltage switches or other supporting circuitry, thereby significantly simplifying the connections from external or internal power sources.

The erase mode is similar to the single cell as described in above-referenced U.S. Pat. No. 6,992,927. That is, word lines RWL(0) ... RWL(N-1) are at logic high, the erase voltage Ve is applied (~10V), and the rest of signals are grounded. Erase will affect all cells. As will be appreciated by those skilled in the art, the erase voltage Ve varies from technology to technology.

The programming mode has two steps: first, SRAM write mode and second, 4T NVM cell program mode.

In the SRAM write mode, data should be read at D(0) ... D(M). Read word lines RWL(0) ... RWL(N-1 are at logic high. One of the word lines (WL), e.g. word line WL(0) should be at logic high. The rest of the word lines WL, WL(1) ... WL(N-1) should be at logic low. To write a zero (program) to the SRAM cell, the corresponding write bit line, e.g. bit line BT(0) should be at logic low and bit line BB(0) at logic high. To write a one (remain erased) to the SRAM cell, the corresponding write bit line, e.g. bit line BB(0) should be logic low and bit line BT(0) at logic high. The number of write cycle depends on the number of rows (N) and the number of columns (M) in the array.

In the 4T cell program mode, the read word lines RWL (0) ... RWL(N-1) are at logic high. Write word lines WL (0) ... WL(N-1) are at logic low. The written SRAM cell provides the logic to program the 4T cell. Control gate voltage Vc is swept from 0v to Vcmax. Vcmax should be larger than the tunneling condition and depends on the technology. Only one cycle is needed to program entire array.

The read mode has a 4T NVM read mode or an SRAM read mode.

In the 4T NVM read mode, one of the read word lines (RWL), e.g. RWL(0) should be at logic low. The rest of read word lines RWL, RWL(1) ... (RWL(N-1) should be at logic high. One of the word lines (WL), e.g. WL(0) should be logic high, the rest of the word lines WL, WL(1) ... WL(N-1) should be at logic low. On all read bit lines RBL (0) ... (RBL(M-1), a high current or voltage will be seen if the cell was programmed and a low current or voltage will be seen if the cell was erased. The read voltage is applied to all the cells. The rest of signals are grounded. The read bit lines RBL(0) ... RBL(M-1) will be sensed using a 4T cell sense amplifier by comparing the current/voltage with a global reference current/voltage. The reference current/voltage is usually provided by a single or a group of the 4T cell replica. The sensed data are latched to QN(0) ... QN(M).

In the SRAM read mode, the read word lines RWL (0) ... RWL(N-1) are at logic high. One of the word lines (WL), e.g. WL(0), should be at logic high, the rest of the word lines WL, WL(1) ... WL(N-1) should be at logic low. If the cell was programmed zero, bit line BT will be discharged to ground. If the cell was programmed one, bit line BB will be discharged to ground. These bit lines are sensed using the SRAM differential sense amplifiers and latched to the output Q(0) ... Q(M).

Figure 9:
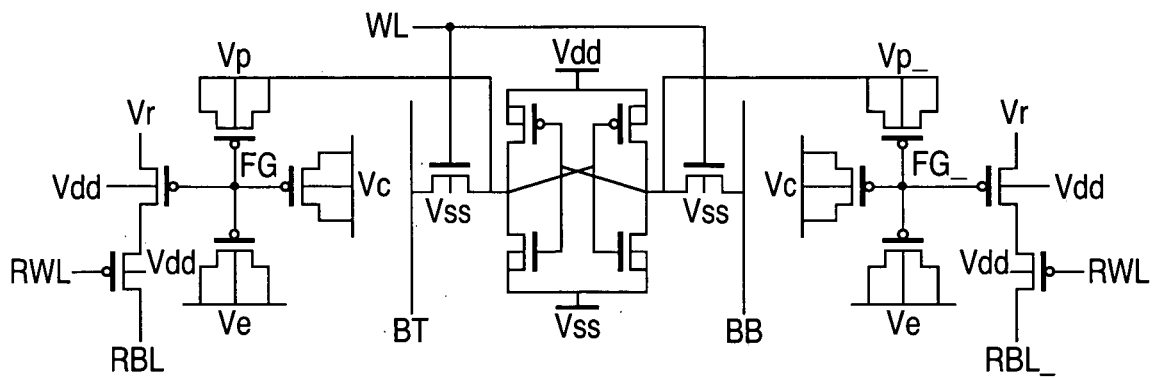
FIG. 9 is a schematic diagram illustrating a dual 4-transistor PMOS NVM cell with an embedded 6-transistor SRAM cell in accordance with the concepts of the present invention.

Sensing of the 4T NVM cell shown in FIG. 7 using a reference cell is greatly susceptible to process and signal integrity variation. Some technologies may have a large process variation across the wafer than the other. Some cell's reference current may not be a good global reference point for all cells for such technology. For such technologies, a dual 4T NVM cells with embedded SRAM cell is provided, as shown in FIG. 9. The addition a second 4T NVM cell serves like a reference. Since the two NVM cells are close to each other, they tend to behave in a similar way. The operation is the same as the single 4T cell described above with respect to FIG. 7. During the NVM read mode, RBL_acts as a reference to RBL.

Figure 10:
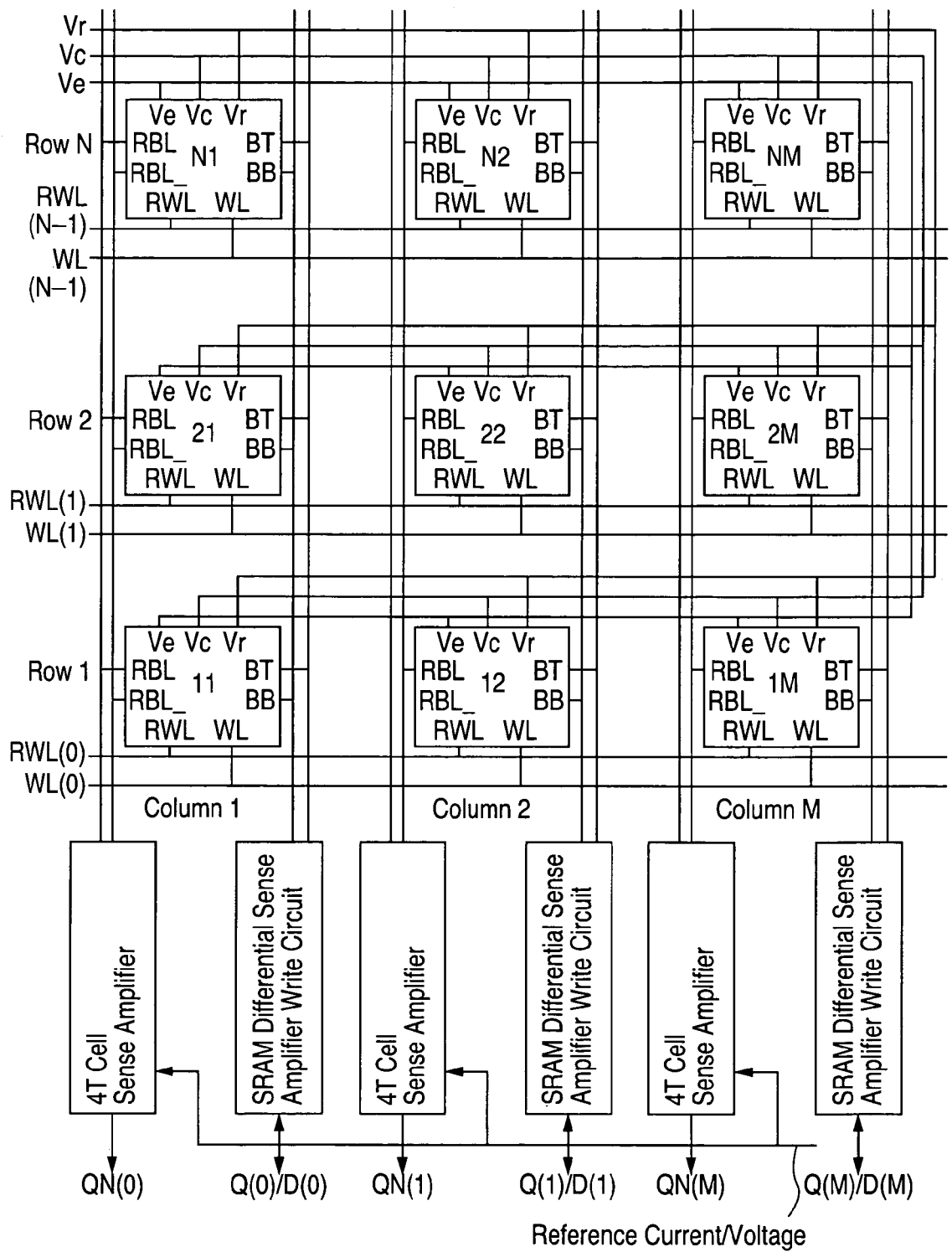
FIG. 10 is a block diagram illustrating an NVM cell array that includes a plurality of dual NVM cells of the type shown in FIG. 9.

FIG. 10 shows the implementation of an array using the dual NVM cell shown in FIG. 9.

Only the array implementation of the proposed cell (FIG. 8 and FIG. 10) using column mux=1 is disclosed herein. The proposed cell array can be implemented in any mux option, i.e. mux=2, mux=4, mux=8 etc.

The advantages of the NVM cell enhancement describe above is to enable programming of the entire NVM array at the same time. The total programming time for the proposed invention is equivalent to SRAM array write timing plus a single NVM cell program time. The SRAM write cycle time is usually small in the nano-second range. The previous art requires a total program time of N M trog. In addition, data read from the NVM array can be written back into the SRAM array by using external circuitry. The SRAM cell provides the capability to access data more quickly.

Those skilled in the art will appreciate that the amount of negative charge trapped on the floating FG during the programming operation depends upon the maximum programming voltage Vcmax and the programming time Tprog. The higher the Vcmax and the longer the Tprog, the more negative charge can tunnel to the floating gate FG.

The methods of erasing and the reading the 4-transistor cell remain the same as described in Popelvine et al. U.S. Pat. No. 6,992,927. That is, for the erase condition: Ve±10V; all other electrodes grounded. For the read condition: Vr~1V; all other electrodes grounded.

The advantages of the NVM cell programming method in accordance with the present invention are very low current consumption and a simple program sequence. Low current consumption allows the possibility of programming a large number of cells at once without the need to create high current sourcing power sources.

It should be understood that the particular embodiments of the invention described above have been provided by way of example and that other modifications may occur to those skilled in the art without departing from the scope and spirit of the invention as expressed in the appended claims and their equivalents.

What is claimed is:

1. A non-volatile memory (NVM) cell structure comprising:
    a first P-IGFET programming transistor having a gate electrode connected to a common storage node;
    a second P-IGFET read transistor having a gate electrode connected to the common storage node;
    a third P-IGFET erase transistor having a gate electrode connected to the common storage node;
    a fourth P-IGFET control transistor having a gate electrode connected to the common storage node; and
    an SRAM cell structure connected to the P-IGFET control transistor.

2. A NVM cell structure as in claim 1, and wherein the SRAM cell structure comprises:
    a 4-transistor cross-coupled latch structure;
    a first NMOS pass gate transistor connected between the latch structure and a first bit line of an associated NVM cell array; and
    a second NMOS pass gate transistor connected between the latch structure and a second bit of the associated NVM cell array.

3. A NVM cell structure as in claim 2, and wherein the first and second NMOS pass gate transistors each include a gate electrode that is connected to a word line of the associated NVM cell array.

4. A NVM cell structure as in claim 3, and further comprising:
    a fifth P-IGFET transistor having a source region connected to the P-IGFET read transistor, a drain region connected to a read bit line of the associated NVM cell array, and a gate electrode connected to a read word line of the associated NVM cell array.

5. A method of programming a NVM cell structure that includes a first P-IGFET programming transistor having a source region, a bulk region, a drain region and a gate electrode connected to a common storage node, a second P-IGFET read transistor having interconnected source and bulk regions, a drain region and a gate electrode connected to the common storage node, a third P-IGFET erase transistor having interconnected drain, source and bulk regions and a gate electrode connected to the common storage node, a fourth P-IGFET control transistor having interconnected drain, source and bulk regions and a gate electrode connected to the common storage node, and an SRAM storage cell connected to the P-IGFET control transistor, the programming method comprising:
    prewriting data to the SRAM storage cell;
    grounding the source region, the drain region and the gate electrode of each of the first, second, third and fourth P-IGFET transistors;
    applying an inhibiting voltage to the interconnected drain, source and bulk regions of the P-IGFET erase transistor and to the drain region of the P-IGFET read transistor, while grounding the source region, and the drain region of the P-IGFET programming transistor and maintaining the bulk region of the P-IGFET programming transistor at either ground or the inhibiting voltage;
    sweeping the interconnected drain, source and bulk regions of the P-IGFET control transistor from 0V to a predefined maximum programming voltage in a preselected programming time; and
    at the end of the preselected programming time, ramping the interconnected drain, source and bulk regions of the P-IGFET control transistor from the predefined maximum programming voltage to 0V and returning all electrodes having the inhibiting voltage applied thereto to ground.

6. A method of programming a non-volatile memory (NVM) cell array that includes a plurality of NVM cells, each NVM cell in the array including a first P-IGFET programming transistor having a source region, a bulk region, a drain region and a gate electrode connected to a common storage node, a second P-IGFET read transistor having interconnected source and bulk regions, a drain region and a gate electrode connected to the common storage node, a third P-IGFET erase transistor having interconnected drain, source bulk regions and a gate electrode connected to the common storage node, a fourth P-IGFET control transistor having interconnected drain, source and bulk regions and a gate electrode connected to the common storage node, and an SRAM storage cell connected to the P-IGFET control transistor, the programming method comprising:

prewriting data to the SRAM storage cells of all NVM cells in the NVM cell array selected for programming;

grounding the source region, the drain region and the gate electrode of each of the first, second, third and fourth P-IGFET transistors in the NVM cell array;

for all NVM cells in the NVM cell array selected for programming, applying an inhibiting voltage to the interconnected source and bulk regions of the P-IGFET read transistor, the interconnected drain, source and bulk regions of the P-IGFET erase transistor and the drain region of the P-IGFET read transistor, while grounding the source region and the drain region of the P-IGFET programming transistor and maintaining the bulk region of the P-IGFET programming transistor at either ground or the inhibiting voltage;

for all NVM cells in the NVM cell array not selected for programming, applying the inhibiting voltage to the source, bulk and drain regions of the P-IGFET read transistor, to the source bulk and drain regions of the P-IGFET erase transistor and to the source, bulk and drain regions of the P-IGFET programming transistor;

sweeping the interconnected drain, source and bulk regions of the P-IGFET control transistors in the NVM cell array from 0V to a predefined maximum programming voltage in a preselected programming time; and at the end of the preselected programming time, ramping the interconnected drain, source and bulk regions of the P-IGFET control transistors in the NVM cell array from the predefined maximum programming voltage to 0V and returning all electrodes having the inhibiting voltage applied thereto to ground.

\* \* \* \* \*

UNITED STATES PATENT AND TRADEMARK OFFICE
CERTIFICATE OF CORRECTION

| | |
|---|---|
| PATENT NO. | : 7,167,392 B1 |
| APPLICATION NO. | : 11/183198 |
| DATED | : January 23, 2007 |
| INVENTOR(S) | : Pavel Poplevine et al. |

It is certified that error appears in the above-identified patent and that said Letters Patent is hereby corrected as shown below:

In Column 8, line 47, change "0V" to --ground--;

In Column 8, line 53, change "0V" to --ground--;

In Column 10, line 9, change "0V" to --ground--; and

In Column 10, line 15, change "0V" to --ground--.

Signed and Sealed this

Tenth Day of April, 2007

JON W. DUDAS
*Director of the United States Patent and Trademark Office*